(12) United States Patent
Lindahl et al.

(10) Patent No.: US 7,711,129 B2
(45) Date of Patent: May 4, 2010

(54) METHOD AND SYSTEM FOR APPROXIMATING GRAPHIC EQUALIZERS USING DYNAMIC FILTER ORDER REDUCTION

(75) Inventors: Aram Lindahl, Palo Alto, CA (US); Joseph Mark Williams, Dallas, TX (US)

(73) Assignee: Apple Inc., Cupertino, CA (US)

( * ) Notice: Subject to any disclaimer, the term of this patent is extended or adjusted under 35 U.S.C. 154(b) by 1425 days.

(21) Appl. No.: 10/799,526

(22) Filed: Mar. 11, 2004

(65) Prior Publication Data

US 2005/0201572 A1 Sep. 15, 2005

(51) Int. Cl.
*H03G 5/00* (2006.01)
(52) U.S. Cl. .............................. 381/98; 381/103; 700/94
(58) Field of Classification Search ........... 381/98–103; 700/94; 708/323
See application file for complete search history.

(56) References Cited

U.S. PATENT DOCUMENTS

| | | | | |
|---|---|---|---|---|
| 4,973,897 | A | * | 11/1990 | Ohsawa .................... 324/76.19 |
| 5,506,910 | A | * | 4/1996 | Miller et al. ................ 381/103 |
| 5,524,290 | A | * | 6/1996 | Ecklund et al. ........... 455/200.1 |
| 5,541,866 | A | * | 7/1996 | Sato et al. ................... 708/323 |
| 5,864,868 | A | | 1/1999 | Contois |
| 6,317,117 | B1 | * | 11/2001 | Goff .......................... 345/156 |
| 6,731,312 | B2 | | 5/2004 | Robbin |
| 7,016,746 | B2 | * | 3/2006 | Wiser et al. .................... 700/94 |
| 7,123,728 | B2 | * | 10/2006 | King et al. ..................... 381/98 |
| 7,184,556 | B1 | * | 2/2007 | Johnson et al. ................ 381/61 |
| 7,409,066 | B2 | * | 8/2008 | Montag et al. ................. 381/98 |
| 2004/0032959 | A1 | * | 2/2004 | Montag et al. ............... 381/103 |
| 2004/0071299 | A1 | * | 4/2004 | Yoshino ....................... 381/98 |
| 2005/0069153 | A1 | * | 3/2005 | Hall et al. .................... 381/103 |

FOREIGN PATENT DOCUMENTS

WO WO 03/023786 A2 3/2003

OTHER PUBLICATIONS

Robbin et al., "SoundJam MP Plus," Version 2.0, Software Manual.

* cited by examiner

*Primary Examiner*—Vivian Chin
*Assistant Examiner*—Fatimat O Olaniran
(74) *Attorney, Agent, or Firm*—Beyer Law Group LLP

(57) ABSTRACT

Improved approaches to flexibly implementing graphic equalizers on media players are disclosed. These approaches provide dynamic order reduction of a multi-band graphic equalizer so that equalizer effects can be timely performed with only limited computational resources. In one embodiment, a media player receives a media item and associated equalizer settings for a multi-band graphic equalizer. The media player can then automatically (i.e., without user action) approximate the multi-band graphic equalizer with the equalizer settings for the media item using a fewer number of filters. Fewer filters means order reduction, and thus reduction in computational requirements. After the multi-band graphic equalizer is approximated, the media player can present the media item to its user in accordance with the reduced complexity, approximated equalizer.

23 Claims, 12 Drawing Sheets

METHOD AND SYSTEM FOR APPROXIMATING GRAPHIC EQUALIZERS USING DYNAMIC FILTER ORDER REDUCTION

CROSS-REFERENCE TO RELATED APPLICATION

This application is related to U.S. application Ser. No. 10/277,418, filed Oct. 21, 2002, and entitled "INTELLIGENT INTERACTION BETWEEN MEDIA PLAYER AND HOST COMPUTER," which is hereby incorporated herein by reference.

BACKGROUND OF THE INVENTION

1. Field of the Invention

The present invention relates to media devices and, more particularly, to equalizer effects for media being presented on media devices.

2. Description of the Related Art

Media players, such as digital media players, are specialized portable computing devices that store and present (e.g., play, display) digital media (e.g., music, videos, or images). Often media players are small hand-held devices with limited media storage capacity and limited media management capability. As a result, media players typically associate with a host computer. The host computer can utilize an application resident on the host computer to perform media management for the host computer and the media player, such management including transfer of the media items and their attributes between the host computer and the media player. One such application is iTunes™, produced by and available from Apple Computer, Inc. of Cupertino, Calif. An example of a popular media player is an iPod™ which is also produced by and available from Apple Computer, Inc.

iTunes can display a graphic equalizer for a user of the host computer. With iTunes, users can specify a set of equalizer settings by selecting one of a list of equalizer presets. Equalizer presets are equalizer settings for various frequency bands that are predetermined and available for selection by users. In addition, users can manually change the settings of a graphic equalizer to achieve a desired (e.g., custom) frequency response for particular media items. To a limited extent, equalizer settings for media items can be transferred from iTunes to the media player. Media players typically have limited computational resources and a small form factor. Consequently, there are difficulties with implementing a graphic equalizer on a media player. One prior solution involves manual conversion of predetermined equalizer settings for the equalizer presets to a simplified filter structure. Such a manual conversion can reduce computational requirements needed to implement the equalizer adjustments on the media player. Unfortunately, however, this prior solution based on manual conversion is time consuming and only effective when the equalizer settings are known and remain fixed. Since the equalizer settings must be fixed, the prior solution also does not support user manipulation of equalizer settings. Other prior solutions involve complex optimization algorithms and/or curve fitting of finite impulse response (FIR) filters. However, these approaches are computationally intensive and not guaranteed to find acceptable solutions, and the resulting filter is usually two or more orders of magnitude more computationally expensive than the original graphic equalizer.

Thus, there is a need for improved approaches to flexibly implement graphic equalizers on media players with limited computational resources.

SUMMARY OF THE INVENTION

Broadly speaking, the invention relates to improved approaches to flexibly implement graphic equalizers on media players. Media players are computing devices that are capable of storing and presenting (e.g., play, display) digital media (e.g., music, videos, or images). Media players typically have limited computational resources and are often portable or small in scale (e.g., hand-held). According to one aspect of the invention, dynamic order reduction of a multi-band graphic equalizer can be timely performed using only limited computational resources.

In one embodiment, a media player receives a media item and associated equalizer settings for a multi-band graphic equalizer. In one implementation, equalizer settings (which are one type of quality setting) can be established for the media items on a media item by media item basis. The media player can then automatically (i.e., without user action) approximate the multi-band graphic equalizer with the equalizer settings for the media item using a fewer number of filters. Fewer filters means order reduction, and thus reduction in computational requirements. After the multi-band graphic equalizer is approximated, the media player can present the media item to its user in accordance with the reduced complexity, approximated equalizer.

Graphic equalizers are used to shape audio frequency responses to a user's preference. The equalizer settings of a multi-band graphic equalizer can be provided to the media player from a host computer. In such case, each media item can have their own equalizer settings. Alternatively, each user can have their own equalizer settings. As an example, the host computer can transfer not only media items but also associated equalizer settings to a media player during a synchronization operation. In another embodiment, equalizer settings can be manipulated locally by a user of the media player. Local manipulation of equalizer settings can provide real-time equalizer adjustment at the media player.

The invention can be implemented in numerous ways, including as a method, system, device, apparatus, or computer readable medium. Several embodiments of the invention are discussed below.

As a computer-implemented method for approximating n-band graphic equalizer settings for a media player using not more than m bands where m is less than n, one embodiment of the invention includes at least the acts of: classifying at least a plurality of the equalizer setting values with respect to characteristics of at least a portion of a frequency response shape of at least one of a plurality of predetermined filter types; and determining parameters for one or more filters of the at least one of the plurality of predetermined filter types used in classifying the equalizer settings. Optionally, the embodiment may further include the act of limiting the number of the one or more filters in the classification to a maximum number of filters.

As a computer-implemented method for approximating n-band graphic equalizer settings for a media player using less than n filters, one embodiment of the invention includes at least the acts of: examining the equalizer setting values for approximate correlation to at least a portion of a frequency response of a shelf type filter; selecting the shelf type filter if a first set of the equalizer setting values approximately correlate; examining the equalizer setting values other than the first set for approximate correlation to at least a portion of a frequency response of a parametric type filter; selecting the parametric type filter if a second set of the equalizer settings approximately correlate; and determining parameters for the shelf type filter and the parametric type filter, wherein at least the shelf type filter and the parametric type filter are used to approximate the n-band graphic equalizer settings for the media player.

As a computer readable medium including at least computer program code for approximating n-band graphic equalizer settings for a computing device player using less than n bands, one embodiment of the invention includes at least: computer program code for classifying at least a plurality of the equalizer setting values with respect to characteristics of at least a portion of a frequency response shape of at least one of a plurality of predetermined filter types; and computer program code for determining parameters for one or more filters of the at least one of the plurality of predetermined filter types used in classifying the equalizer settings.

As a system for approximating an n-band graphic equalizer for use on a device having limited computational resources or computational time, one embodiment of the invention includes at least: means for classifying at least a plurality of equalizer setting values of the n-band graphic equalizer with respect to characteristics of at least a portion of a frequency response shape of at least one of a plurality of predetermined filter types; and means for determining parameters for one or more filters of the at least one of the plurality of predetermined filter types used in classifying the equalizer settings.

As a media device, one embodiment of the invention includes at least: a data store for storing media data received from a host computer, the media data include media content and equalizer setting information for at least one media item; and a processor operatively connected to the data store, the processor operates to acquire equalizer setting values based on the equalizer setting information, to approximate the equalizer setting values with a reduced filter order approximation, and to present the media content at the media player in accordance with the reduced filter order approximation.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to improved approaches to flexibly implement graphic equalizers on media players. Media players are computing devices that are capable of storing and presenting (e.g., play, display) digital media (e.g., music, videos, or images). Media players typically have limited computational resources and are often portable or small in scale (e.g., hand-held). According to one aspect on the invention, dynamic order reduction of a multi-band graphic equalizer can be timely performed on media players with only limited computational resources.

In one embodiment, a media player receives a media item and associated equalizer settings for a multi-band graphic equalizer. In one implementation, equalizer settings (which are one type of quality setting) can be established for the media items on a media item by media item basis. The media player can then automatically (i.e., without user action) approximate the multi-band graphic equalizer with the equalizer settings for the media item using a fewer number of filters. Fewer filters means order reduction, and thus reduction in computational requirements. After the multi-band graphic equalizer is approximated, the media player can present the media item to its user in accordance with the reduced complexity, approximated equalizer.

Graphic equalizers are used to shape audio frequency responses to a user's preference. The equalizer settings of a multi-band graphic equalizer can be provided to the media player from a host computer. In such case, each media item can have their own equalizer settings. Alternatively, each user can have their own equalizer settings. As an example, the host computer can transfer not only media items but also associated equalizer settings to a media player during a synchronization operation. In another embodiment, equalizer settings can be manipulated locally by a user of the media player. Local manipulation of equalizer settings can provide real-time equalizer adjustment at the media player.

Embodiments of these aspects of the invention are discussed below with reference to FIGS. 1-11. However, those skilled in the art will readily appreciate that the detailed description given herein with respect to these figures is for explanatory purposes as the invention extends beyond these limited embodiments.

Figure 1:
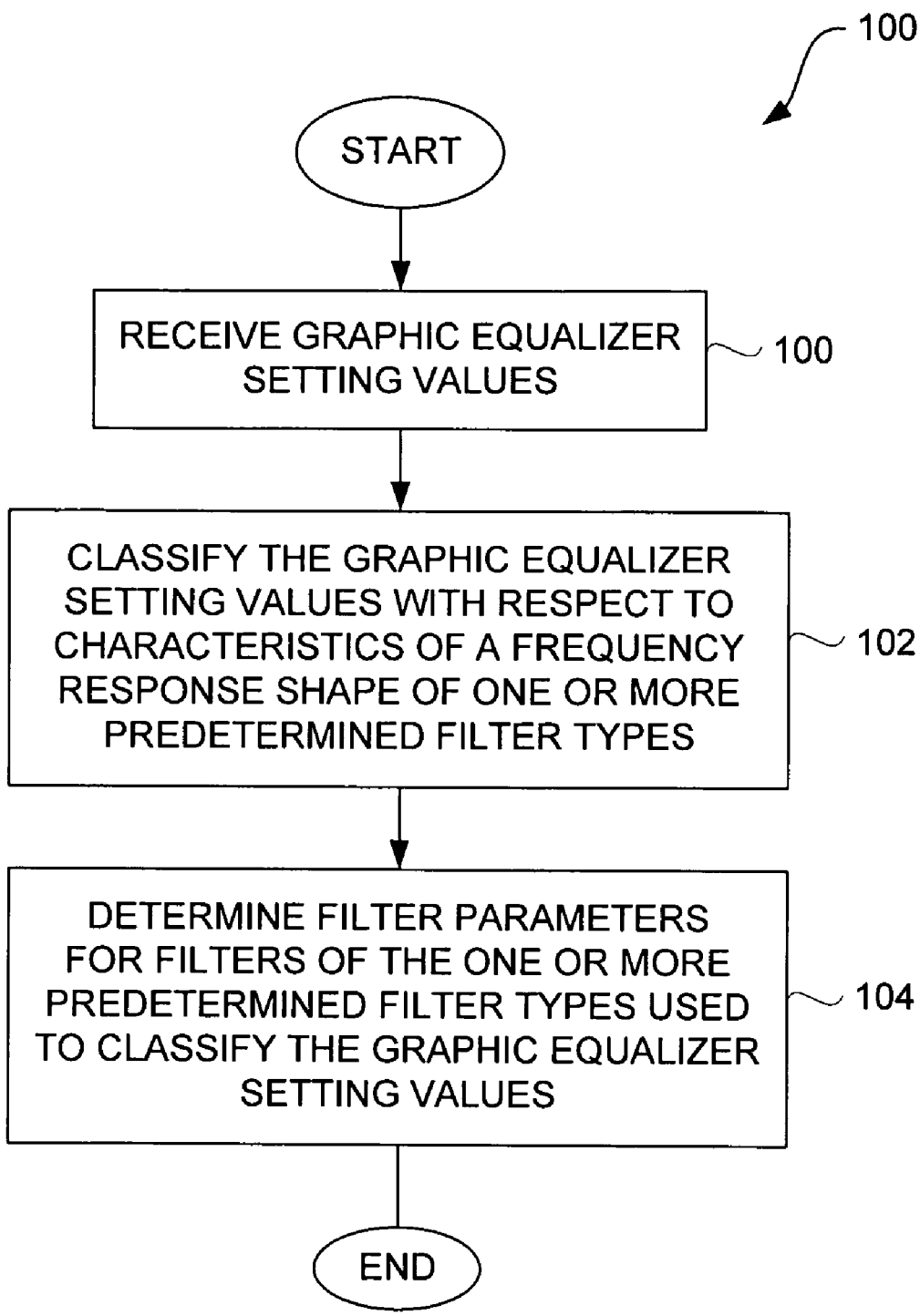
FIG. 1 is a flow diagram of an equalizer characterization process according to one embodiment of the invention.

FIG. 1 is a flow diagram of an equalizer characterization process 100 according to one embodiment of the invention. The equalizer characterization process 100 is designed to be performed on a portable computing device having limited resources, such as limited computation capability and/or processing power. For example, the equalizer characterization process 100 is suitable for use on a hand-held media player attempting to approximate a graphic equalizer that has been used to alter the frequency response of a plurality of bands associated with media items that are capable of being presented at the media player.

The equalizer characterization process 100 initially receives graphic equalizer setting values. The graphical equalizer setting values are the levels for each of a plurality of bands (frequency bands) associated with the graphic equalizer. Typically, a graphic equalizer might have 10 bands and the amplitude settings for each of these bands can be controlled by a user, a device, or by a software application or module. For example, the various bands of a graphic equalizer can each correspond to particular frequencies. For example, one representative 10-band graphic equalizer would have ten (10) bands centered around the following frequencies: 32, 64, 125, 250, 500, 1000, 2000, 4000, 8000 and 16000 Hertz (Hz).

After the graphic equalizer setting values have been received 100, the equalizer characterization process 100 classifies 102 the graphic equalizer setting values with respect to characteristics of a frequency response shape of one or more predetermined filter types. Here, the graphic equalizer setting values are examined in an automatic fashion to determine the extent to which they can be classified as similar to at least a portion of a frequency response shape of one or more of the predetermined filter types. The predetermined filter types have known frequency response shapes and these shapes can be compared with the shape of the composite frequency response represented by the graphic equalizer setting values. In one embodiment, the predetermined filter types correspond to second order recursive filters of the particular types referred to as low-shelf, high-shelf and parametric.

Once the graphic equalizer setting values have been classified to the one or more predetermined filter types, filter parameters for filters of the one or more predetermined filter types that are used to classify the graphic equalizer setting values can be determined 104. Here, it is assumed that the number of filters of the one or more predetermined filter types being utilized to classify the graphic equalizer setting values is significantly less than the number of bands of the graphic equalizer. For example, if the representative graphic equalizer has 10 bands, then the filters of the one or more predetermined filter types being used to classify the graphic equalizer setting values would typically be less than five. In certain implementations, given that computation time and/or ability is limited, the total number of filters can be limited or the number of filters of each of predetermined filter types can be limited. For example, the 10-band representative graphic equalizer might have to be approximated with not more than three filters chosen from of the predetermined filter types. Following the determination 104 of the filter parameters, the equalizer characterization process 100 is complete and ends.

Figure 2:
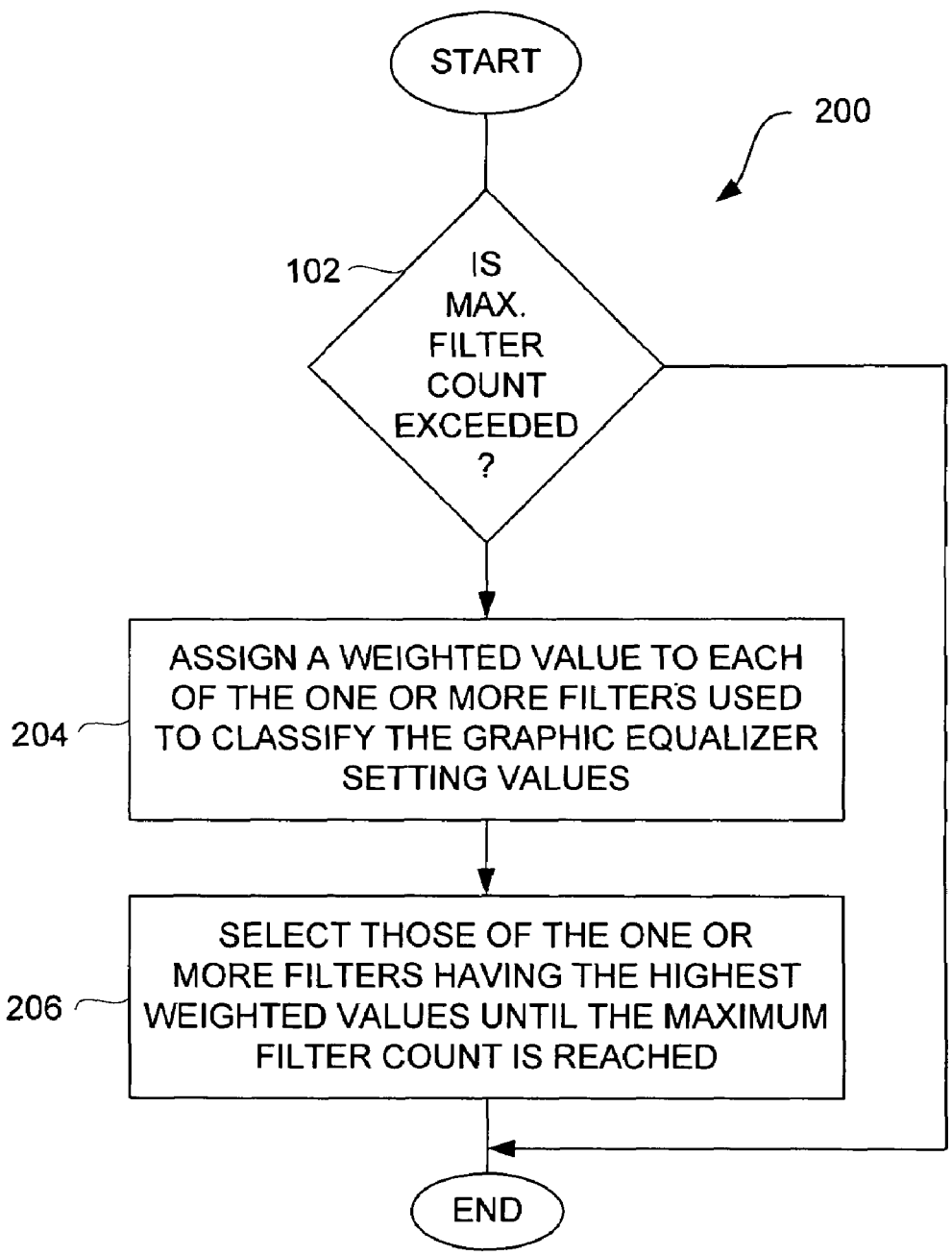
FIG. 2 is a flow diagram of a filter selection process according to one embodiment of the invention.

FIG. 2 is a flow diagram of a filter selection process 200 according to one embodiment of the invention. The filter selection process 200 can be used to restrict the maximum number of filters of the predetermined filter types that are utilized to approximate the graphic equalizer. Accordingly, the filter selection process 200 can be performed following the equalizer characterization process 100 illustrated in FIG. 1. For example, if the equalizer characterization process 100 characterized the graphic equalizer using a combination of four filters selected from three predetermined filter types, and if the maximum number of filters to be utilized is three, then the filter selection process 200 would choose three of the four filters.

The filter selection process 200 initially determines 202 whether a maximum filter count (maximum number of filters) has been exceeded. The maximum filter count is a configurable setting in one embodiment of the invention. The maximum filter count serves to limit the processing time and/or computational burden associated with effectuating the equalizer impact at the portable computing device (e.g., hand-held media player). When the decision 202 determines that the maximum filter count has been exceeded, then a weighted value is assigned 204 to each of the filters (of the one or more predetermined filter types) being used to classify the graphic equalizer setting values. The weighting values can be assigned 204 in a variety of different ways so as to impose some sort of priority to the filters being used to classify the graphic equalizer setting values. In one embodiment, these weighted values depend upon how much of an impact the particular predetermined filter type has on the resulting composite frequency response that is being approximated. For example, a filter of one of the predetermined filter types that correlates to a greater portion of the composite frequency response of the graphic equalizer than another filter can be assigned a higher weighted value than that of the other filter. In another embodiment, different predetermined filter types can be assigned different weighted values.

After the weighted values have been assigned 204, the filter selection process 200 selects 206 those of the filters (of the one or more predetermined filter types) having the highest weighted values until the maximum filter count is reached. The remaining filters (if any) that were used in the classification, but not selected 206, are discarded and not further utilized to approximate the graphic equalizer. Following the block 206, as well as directly following the decision 202 when the maximum filter count is not exceeded, the filter selection process 200 is complete and ends.

Figure 3A:
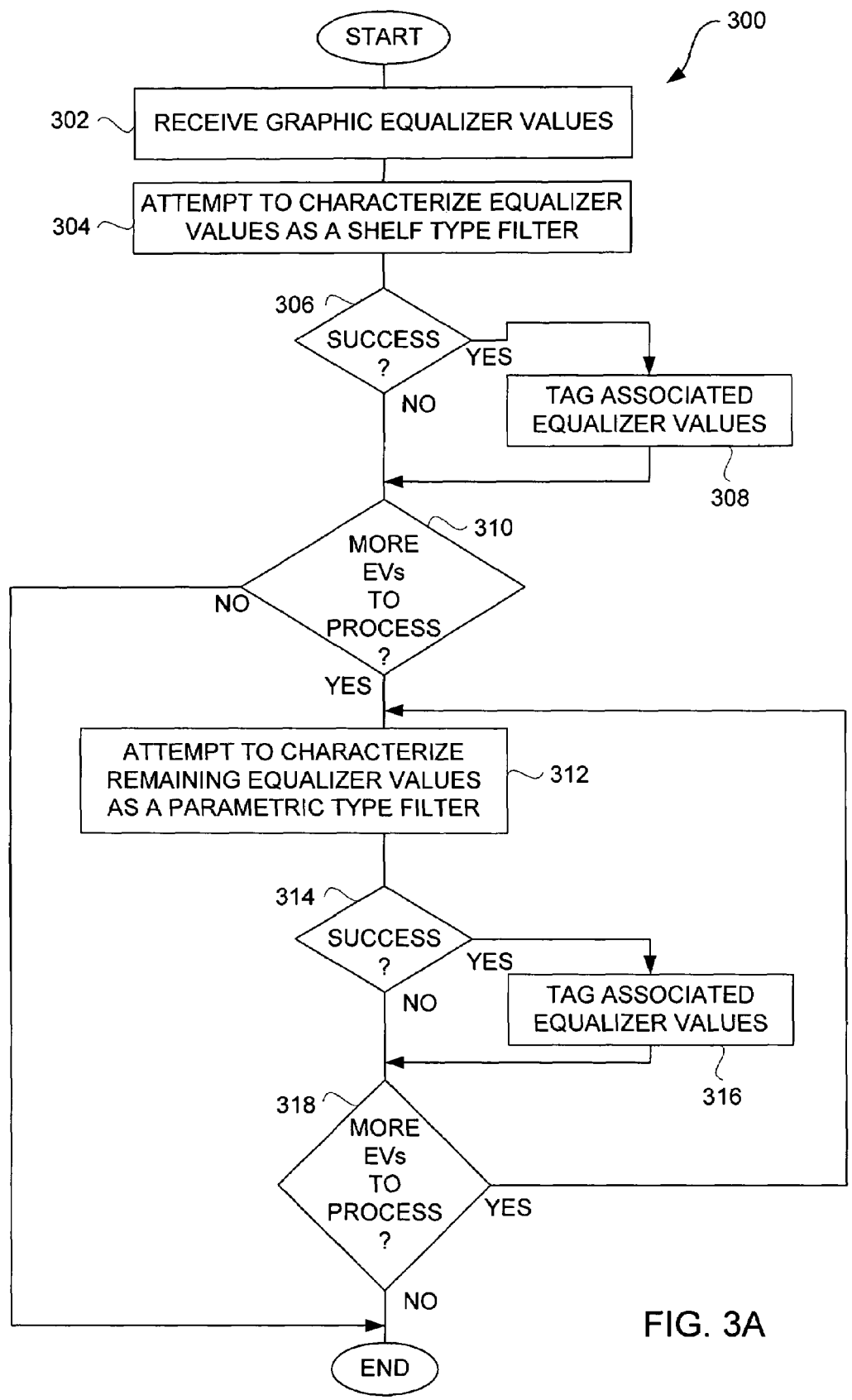
FIG. 3A is a flow diagram of an equalizer characterization process according to another embodiment of the invention.

FIG. 3A is a flow diagram of an equalizer characterization process 300 according to another embodiment of the invention. The equalizer characterization process 300 represents a more detailed process for equalizer characterization than the equalizer characterization process 100 illustrated in FIG. 1.

The equalizer characterization process 300 initially receives graphic equalizer values. Then, the equalizer characterization process 300 attempts 304 to characterize the equalizer values as a shelf-type filter. This characterization attempt 304 can attempt to characterize the equalizer values as a low-shelf type filter and/or a high-shelf type filter. In one implementation, an attempt to characterize the equalizer values as low-shelf would start with the lowest frequency equalizer value and work upward in frequency, whereas an attempt to characterize the equalizer values as a high-shelf would start with the highest frequency equalizer value and work downward in frequency.

A decision 306 then determines whether the attempt 304 to characterize has been successful. When the decision 306 determines that the attempt 304 to characterize has been successful, then the one or more associated equalizer values which are being characterized are tagged 308. Following the block 308, as well as following the decision 306 when the attempt 304 to characterize was unsuccessful, a decision 310 determines whether there are more equalizer values to be processed. When the decision 310 determines that there are more equalizer values to be processed, the equalizer characterization process 300 attempts 312 to characterize the remaining equalizer values as a parametric type filter. For example, the attempt 312 to characterization process can attempt to characterize equalizer values as any one or more of a plurality of different types of parametric filters, such as parametric boost or a parametric cut A decision 314 then determines whether the attempt 312 to characterize has been successful. When the decision 314 determines that the attempt 312 to characterize has been successful, then the associated equalizer values that have been characterized are tagged 316. Following the block 316, as well as following the decision 314 when the attempt 312 to characterize has been unsuccessful, a decision 318 determines whether there are more equalizer values to process. Here, those equalizer values that have been already tagged need not be further processed. Furthermore, some of the equalizer values may not be characterized and thus be deemed irrelevant or less important. Hence, the decision 318 need not repeatedly attempt to characterize remaining equalizer values that have not yet been tagged.

In any case, when the decision 318 determines that there are more equalizer values to be processed, the equalizer characterization process 300 returns to repeat the block 312 and subsequent operations so that the remaining untagged equalizer values have some opportunity, though limited, to be characterized. In this regard, the characterization of the equalizer values can include more than one parametric type filter in its characterization. In one implementation, the characterization of the equalizer values can make use of not more than one low-shelf type filter, not more than one high-shelf type filter, and not more than n parametric type filters, where n is the number of bands of the graphic equalizer.

When the decision 318 determines that there are no more equalizer values to be processed or when the decision 310 determines that there are no more equalizer values to be processed, then the equalizer characterization process 300 is complete and ends.

Figure 3B:
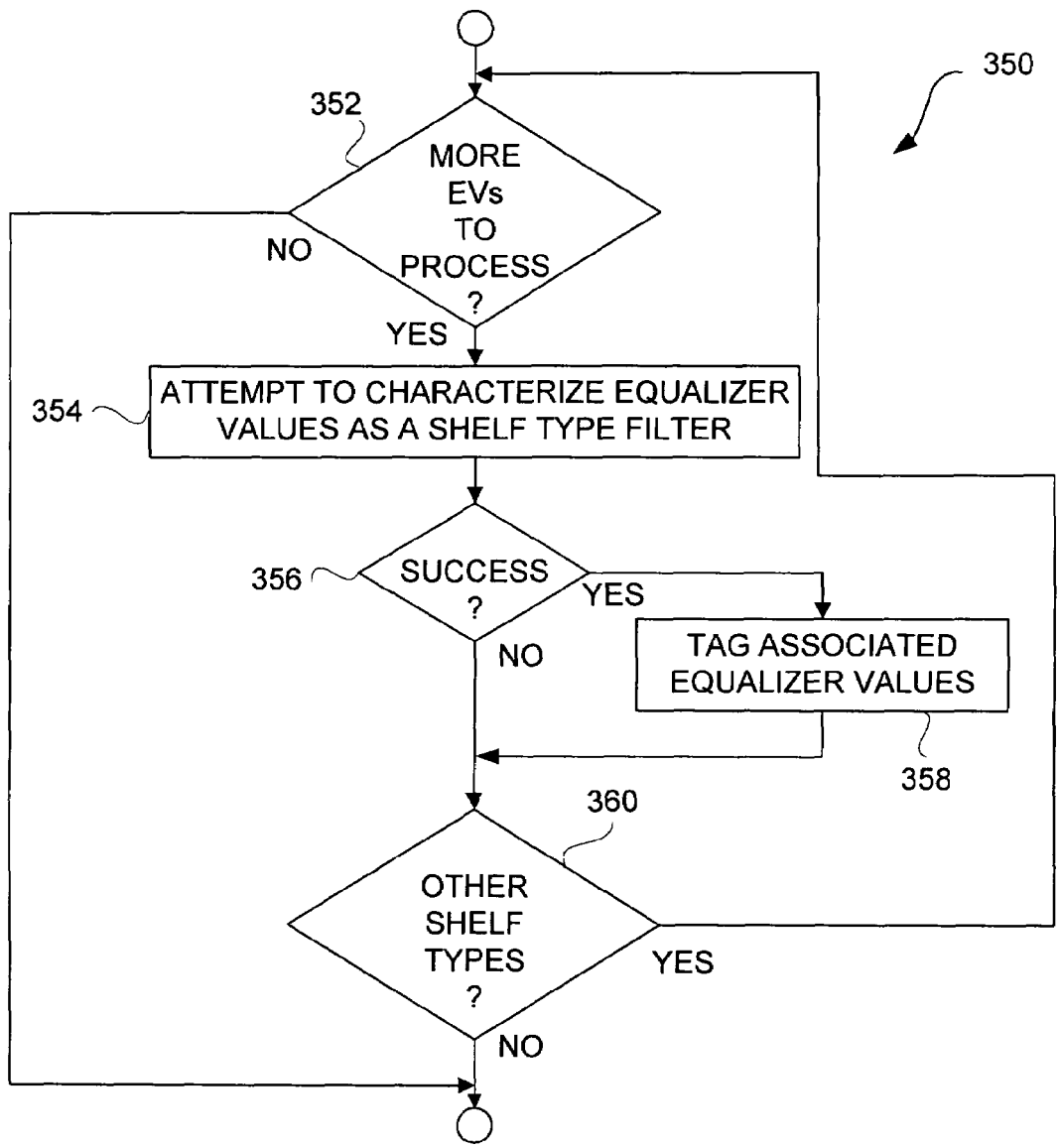
FIG. 3B is a flow diagram of an alternative flow diagram for a portion of the equalizer characterization process illustrated in FIG. 3A.

FIG. 3B is a flow diagram of an alternative flow diagram for a portion 350 of the equalizer characterization process 300 illustrated in FIG. 3A. In this embodiment, the operations 304-308 of the equalizer characterization process 300 illustrated in FIG. 3A are replaced by operations 352-360 illustrated in FIG. 3B. The operations 352-360 are explained as follows. A decision 352 determines whether there are more equalizer values to be processed. When the decision 352 determines that there are more equalizer values to be processed, the equalizer characterization process attempts 354 to characterize the equalizer values as a shelf-type filter. A decision 356 then determines whether the attempt 354 to characterize was successful. When the decision 356 determines that the attempt 354 to characterize was successful, then the one or more associated equalizer values being characterized are tagged 358. Following the block 358, as well as following the decision 356 when the attempt 354 to characterize was unsuccessful, a decision 360 determines whether there are other self type filters to be considered. For example, the equalizer characterization process can attempt to characterize equalizer values as a plurality of different types of shelf filters, such as low shelf boost, low shelf cut, high shelf boost or high shelf cut. When the decision 310 determines that there are more shelf type filters to be considered, the equalizer characterization process returns to repeat the decision 352 and subsequent operations so that remaining (e.g., untagged) equalizer values can be again considered for another one of the types of shelf filters. When the decision 360 determines that there are no more other types of shelf filters to be processed or when the decision 352 determines that there are no more remaining equalizer values to be processed, portion 350 of the equalizer characterization process is completed.

Figure 4:
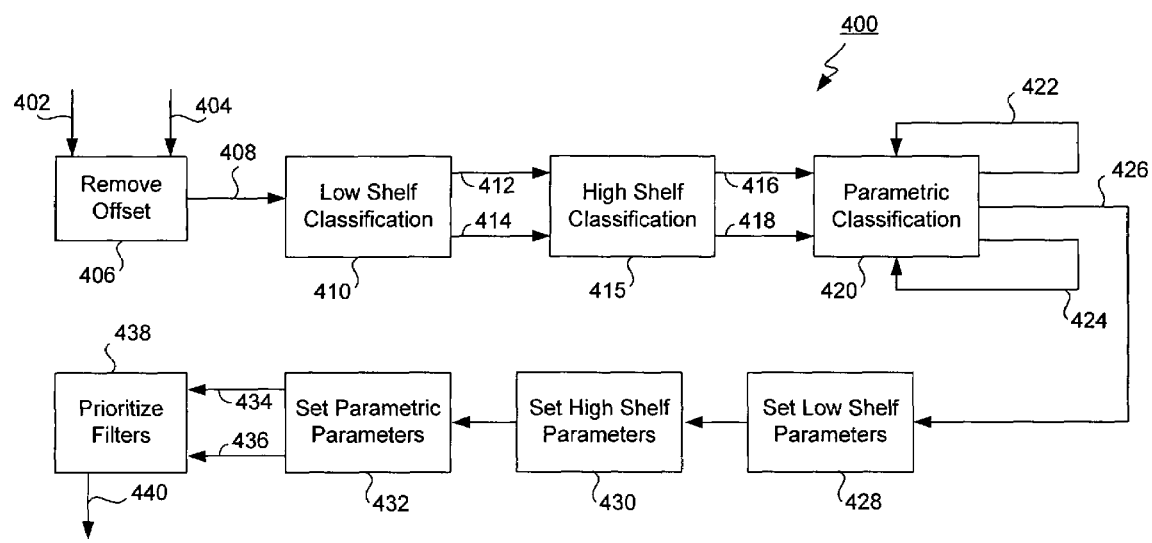
FIG. 4 is a block diagram of a filter order reduction state machine according to one embodiment of the invention.

FIG. 4 is a block diagram of a filter order reduction state machine 400 according to one embodiment of the invention. Each of the states of the state machine are represented by a block in FIG. 4. The filter order reduction state machine 400 can be considered to have four different phases. In phase 1, a gain offset is extracted. In phase 2, graphic equalizer values are classified. In phase 3, filter parameters for filters are estimated. In phase 4, the filters are prioritized.

The filter order reduction state machine 400 receives graphic equalizer parameters 402 and a maximum filter count 404 as inputs. The remove offset block 406 receives the graphic equalizer parameters 402 and the maximum filter count 404. The remove offset block 406 removes any positive or negative offsets from the equalizer values and stores such offsets for later use. This offset removal serves to produce normalized graphic equalizer values 408 that are supplied to a low-shelf classification block 410. In the low-shelf classification block 410, the normalized graphic equalizer values are examined to determine whether a low-shelf classification can be utilized to approximate at least a portion of its composite frequency response. The result of the low-shelf classification block 410 is either that there are no matches 412 or matches found 414. In the case in which matches are found, the matching graphic equalizer values are tagged as being classified.

Next, a high-shelf classification block 415 receives the no matches 412 or the matches found 414 from the low-shelf classification block 410. The high-shelf classification block 415 examines the remaining graphic equalizer values to determine whether a high-shelf classification can be utilized to approximate at least a portion of its composite frequency response. The result of the high-shelf classification is either no matches 416 or matches found 418. In the case in which matches are found, the matching graphic equalizer values are tagged as being classified.

A parametric classification block 420 then follows the high-shelf classification block 415. The parametric classification block 420 receives the no matches 416 and the matches found 418 from the high-shelf classification block 415. The parametric classification block 420 attempts to classify the remaining graphic equalizer values as having a parametric frequency response. When the parametric classification block 420 determines that an initial parametric classification attempt was not successful in finding any matches, the parametric classification block 420 can repeat 422. On the other hand, when the parametric classification block 420 indicates that a match has been found, the associated graphic equalizer values are tagged and then the parametric classification block 420 can be repeated 424.

After the parametric classification block 420 has attempted to classify any remaining unclassified graphic equalizer values, composite classification information 426 is provided to a set low-shelf parameters block 428 where the low-shelf parameters for the low-shelf filter used in the classification, if any, are determined. Then, a set high-shelf parameters block 430 can determine the high-shelf parameters for the high-shelf filter, if any, used in the classification are determined. Next, a set parametric parameters block 432 operates to determine the parametric parameters for the zero to several parametric filters that may be used in the classification.

Thereafter, the various filter parameters 434 and a number of filters found 436 are supplied to a prioritize filters block 438. The prioritize filters block 438 operates to prioritize the various filters used in the classification and then select those filters having the highest priority up to but not exceeding the maximum filter count. Of course, when the number of filters found is less than the maximum filter count, the prioritize filters block 438 need not reduce the number of filters used in the classification. Finally, the prioritize filters block 438 outputs parametric equalizer parameters 440 that are used to approximate the composite frequency response of the graphic equalizer.

Graphic equalizers are used to shape audio frequency responses to a user's preference via a factory preset or by a user's manipulation of individual gain values. A graphic equalizer has N bands, each band corresponding typically to a second (2nd) order recursive filter. The 2nd order recursive filter peaks or cuts depending on the gain setting, but has its frequency and width of the filter fixed. In one embodiment, the representation of the graphic equalizer that the invention operates on is a set of gain values and their corresponding frequencies. An example of such gain values and corresponding frequencies are:

| FREQUENCY (Hertz) | GAIN |
|---|---|
| 32 | 0 |
| 64 | 0 |
| 125 | 0 |
| 250 | 0 |
| 500 | −1.8 |
| 1000 | −4 |
| 2000 | −3 |
| 4000 | 2 |
| 8000 | 3.8 |
| 16000 | 3 |

Figure 5:
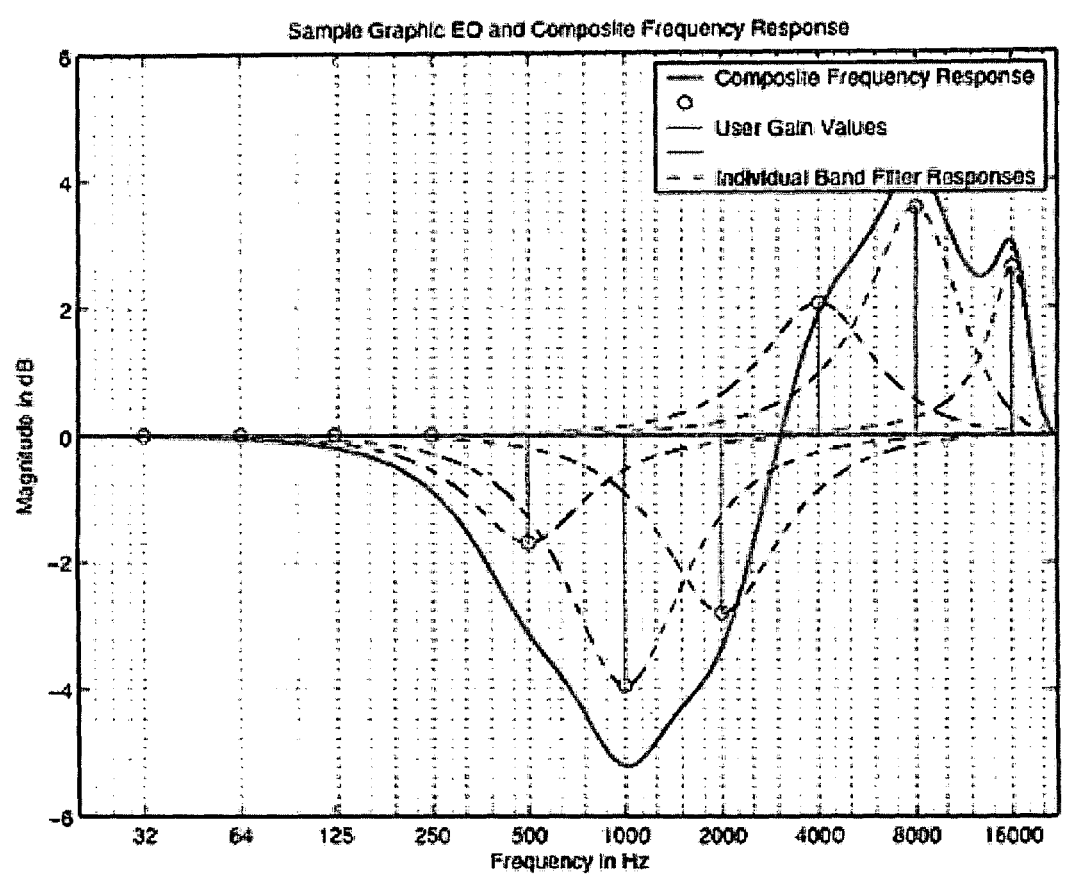
FIGS. 5-7 are exemplary plots of frequency responses for different equalizer settings.

These individual band filter frequency responses and the resulting composite frequency response curve can be plotted. FIG. 5 illustrates exemplary plots of frequency responses for user gain values, individual band filter responses, and a composite frequency response.

In one embodiment, an objective is to minimize the number of 2nd order recursive filters needed to approximate the composite frequency response without having to perform any expensive frequency response calculations or highly problematic auto-regressive curve modeling.

A detailed equalizer characterization process according to one embodiment of the invention is described below. The detailed equalizer characterization process can be considered to be concerned with "just noticeable differences" that are perceivable to the average listener. This flexibility provided by the "just noticeable differences" may be approximated by simple thresholds or based on detailed perceptual models. The detailed equalizer characterization process can consist of four phases: (1) Removal and storage of any fixed gain offset; (2) Classification of filter type (namely, low-shelf, high-shelf or parametric); (3) Determination of parameters (e.g., filter's gain, center frequency and/or Q (normalized resonance); and (4) Prioritization of filters. Each of these four phases is described in greater detail below in a pseudo-code fashion.

Phase 1: Extract Gain Offset
  a. Search the graphic EQ gain vector for a positive gain offset.
  b. If no positive gain offset is found, search for a negative gain offset.
  c. If gain offset is found, subtract it from all equalizer gains and store the offset. The gain offset will be added back in after the order reduction.

Phase 2: Classification
a. Search graphic EQ gain vector for low-shelf with boost.
  i. Look for consecutive values with a decreasing trend (within a tolerance band) starting with a gain greater than JND dB.
    1. Start at lowest frequency and compare consecutive frequency bin gains.
    2. If gains are within the JND tolerance band consider this close enough for a match.
    3. Classify frequency index (bin) as low-shelf boost and continue to next bin.
  ii. If a low shelf with boost pattern is found (2 or more frequencies classified), increment filter count.
b. Search graphic EQ gain vector for low-shelf with cut (mutually exclusive with low-shelf boost).
  i. Look for consecutive values with an increasing trend (within the JND tolerance band) starting with a gain less than JND dB.
    1. Start at lowest frequency and compare consecutive frequency bin gains.
    2. If gains are within a tolerance band consider this close enough for a match.
    3. Classify frequency index (bin) as low-shelf cut and continue to next bin.
  ii. If a low shelf with cut pattern is found (2 or more frequencies classified), increment filter count.
c. Search graphic EQ gain vector for high-shelf with boost.
  i. Same as low-shelf cases, except start at the highest frequency and compare consecutive decreasing frequency bin gains starting with a gain greater than JND dB.
  ii. Ignore all bins already classified.
d. Search graphic EQ gain vector for high-shelf with cut (mutually exclusive with high-shelf boost).
  i. Same as high-shelf with boost, start with gain less than JND dB.
e. Search graphic EQ gain vector for parametric with boost.
  i. Look for local maximum in bins not classified as low-shelf or high-shelf.
    1. Start at lowest frequency and compare consecutive frequency bin gains within the JND tolerance band.
    2. When a local maximum is found (a low-high-low pattern of N elements), classify frequency bin as parametric with an index (as there may be more than one parametric).
    3. Step in both directions, classifying bins that are decreasing within a tolerance band as part of this parametric filter, assuming they have not already been classified.
    4. Repeat this search pattern until all frequency bins have been analyzed.
  ii. If a parametric with boost pattern is found, increment filter count.
f. Search graphic EQ gain vector for parametric with cut.
  i. Look for local minimum in bins not classified as low-shelf, high-shelf or parametric with boost.
    1. Start at lowest frequency and compare consecutive frequency bin gains.
    2. When a local minimum is found (a high-low-high pattern of N elements), classify frequency bin as parametric with an index (as there may be more than one parametric).
    3. Step in both directions, classifying bins that are increasing within the JND tolerance band as part of this parametric filter, assuming they have not already been classified.
    4. Repeat this search pattern until all frequency bins have been analyzed.
  ii. If a parametric with cut pattern is found, increment filter count.

Phase 3: Estimate Filter Parameters
a. Filter gain
  i. Shelf filters
    1. Set the gain to the largest +/− dB gain out of the frequencies classified as a shelf.
  ii. Parametric
    1. Set the gain equal to that of the interpolated center frequency bin.
  iii. Look for competing filters
    1. If consecutive filters are close (frequency parameters are within two octaves for example) and have opposite sign gain parameters, add gain to each to compensate.

b. Filter center frequency
  i. Shelf filters
    1. On the first pass, search for the frequency bin with gain closest to half the shelf's total gain, known as the mid-gain point.
    2. If the gain is not changing more than JND dB 2 bins beyond the mid-gain point and the shelf filter continues this point, set the center frequency bin to 2 bins beyond mid-gain point.
    3. Otherwise, step back towards the mid-gain point setting the center frequency bin when the gain does not change more than JND dB.
  ii. Parametric
    1. Initially set the center frequency to the bin with the largest gain value out of the frequencies in this parametric set.
    2. Look at its neighboring bins (even if they are classified already as another filter type).
      a. If one neighbor is close in gain to the gain at the current center frequency estimate, split the difference and set the center frequency in between the two and increase the gain by an amount proportional to the gain at the center frequency (½ or ¼).
c. Filter Q
  i. Shelf filters
    1. Take the derivative of the graphic EQ gain vector (calculate consecutive gain differences).
    2. If the shelf filter consists of at least 3 bins:
      a. If the ratio of the largest two values of the derivative is larger than a specified value or the largest value of the derivative is at least one-half as large as the shelf's gain, assign a higher Q to the shelf.
      b. Otherwise, if the ratio of the largest 2 values is small and there are at least 4 bins in the shelf, assign a lower Q.
    3. Otherwise, if the shelf filter consists of at least 2 bins:
      a. If the derivative is at least above a specified tolerance, assign a higher Q to the shelf.
  ii. Parametric
    1. Average the bin gain values to the left and right of the center bin (even if they are classified already as another filter type). If the difference between the center bin gain and the average is large, set the Q to a proportionally high value (e.g., 8). If the differences are small, set the Q to a proportionally low value (e.g., 0.5).
      a. The Q value may be set with a small table that maps the average bin values to a Q setting to avoid division.
Phase 4: Prioritization
a. Rank by sum of gain of bins matched.
  i. Between equal gains, wider bandwidth wins.
b. Remove filters from list starting with lowest ranking until target number of filters is reached.

Figure 6:
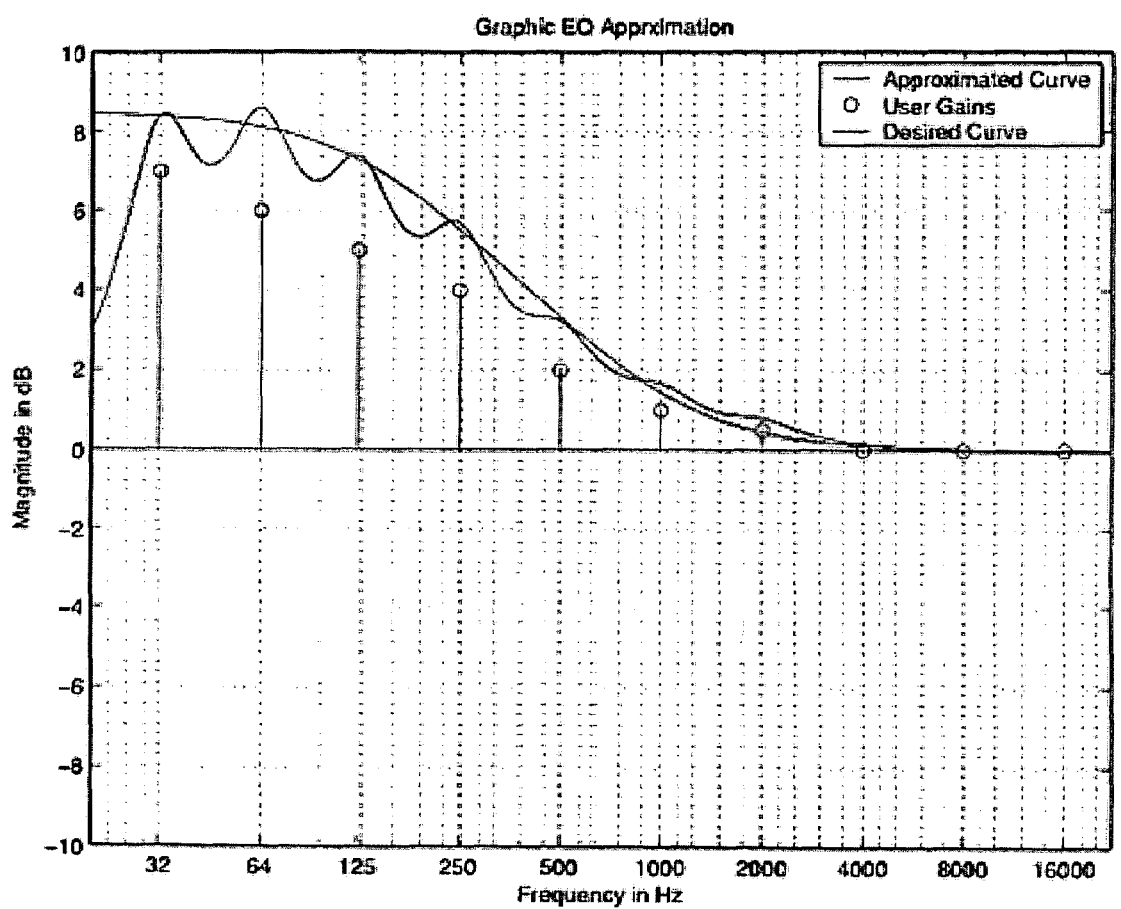
Figure 7:
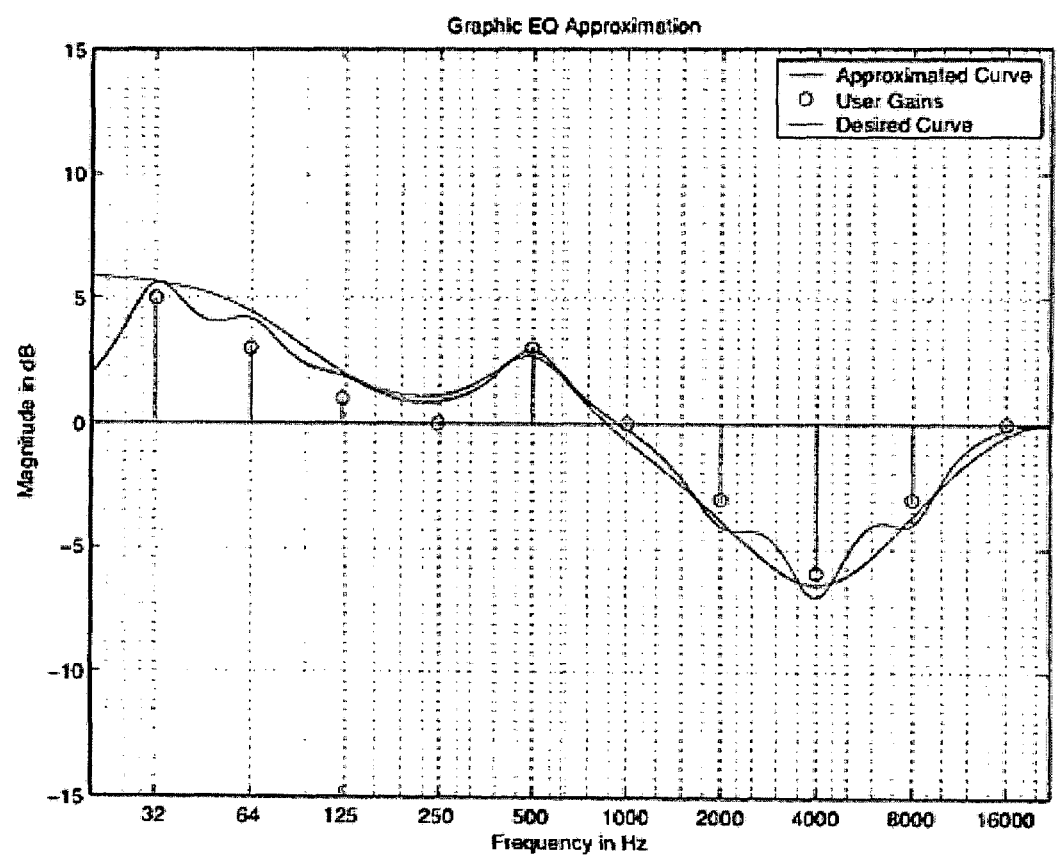

FIGS. 5-7 are exemplary plots of frequency responses for different equalizer settings. In one embodiment, an objective is to minimize the number of 2nd order recursive filters needed to approximate the composite frequency response without having to perform any expensive frequency response calculations or highly problematic auto-regressive curve modeling.

The advantages of the invention are numerous. Different aspects, embodiments or implementations may yield one or more of the following advantages.

One advantage of the invention is that an equalizer characterization process can reduce the computational complexity of implementing a graphic equalizer without significantly changing its perceived effect to the eventual user (e.g., listener) of media items.

For example, the equalizer characterization process can convert a 10-band graphic equalizer to a single shelf filter. Since each filter type requires the same number of operations, it would be about ten times faster to execute after conversion to a single shelf filter. FIG. 6 illustrates exemplary plots of frequency responses for user gain values, a composite frequency response (i.e., desired curve), and an approximated frequency response (i.e., approximated curve) based on the single shelf filter. Here, the single shelf filter is able to closely approximate the desired curve.

As another example, the equalizer characterization process can convert a 10-band graphic equalizer to three filters, namely, one shelf filter and two parametric filters. Since each filter type requires the same number of operations, it would be more than three times faster to execute after conversion. FIG. 7 illustrates exemplary plots of frequency responses for user gain values, a composite frequency response (i.e., desired curve), and an approximated frequency response (i.e., approximated curve) based on the one shelf filter and two parametric filters. Here, the combination of the one shelf filter and two parametric filters is able to closely approximate the desired curve.

A portable computing device (e.g., hand-held media player) or other embedded platform may not be able to run more than a few bands of a many band equalizer. Hence, another advantage of the invention allows a high computational load equalizer to be represented and run on lower performance hardware. The reduced computational load also helps the portable computing device conserve power, which is particularly beneficial for battery powered device.

For example, a low performance computing device (e.g., media player or other embedded device) can perform an equalizer characterization process at run time when a file is downloaded to the device or when loaded for playback. Further, the equalizer characterization process can also be performed in real-time so as to enable a user to dynamically alter equalizer settings during playback.

Still another advantage of the invention is that a equalizer characterization process does not require any complex optimization problems to be solved. For example, implementations of the invention can avoid math intensive frequency response calculations. No curve-fitting operations, which have unknown or hard to bound solution times, need be performed. Auto-regressive models that are very difficult to optimize are also avoided. The use of costly trigonometric functions (sin, cos, sin h) to determine filter coefficients can also be avoided. Hence, by avoiding complex optimization problems, computation time for the equalizer characterization process can be substantially faster, guaranteed to happen and bounded.

Yet still another advantage of the invention is that an equalizer characterization process can be flexible. For example, any M-band graphic equalizer to be converted to an N-band parametric filter representation, where N is less than M and determined by the target complexity of the equalizer implementation.

Still yet another advantage of the invention is that an equalizer characterization process can include the concept of tolerance bands based on human JND (just noticeable differences). This tolerance can serve to ignore or group gain changes that are not perceptually distinct, thereby saving additional computation resources that would otherwise be wasted.

In one implementation, the host computer can interact with the portable computing device. For example, the host computer can transfer media items and associated equalizer information (e.g., equalizer values or one or more equalizer codes) to the portable computing device (e.g., hand-held media player). The host computer can utilize an application resident on the host computer to perform the transfer of the media items and their attributes between the host computer and the portable computing device. One such application is iTunes, version 2.0, produced by Apple Computer, Inc. of Cupertino, Calif.

Figure 8:
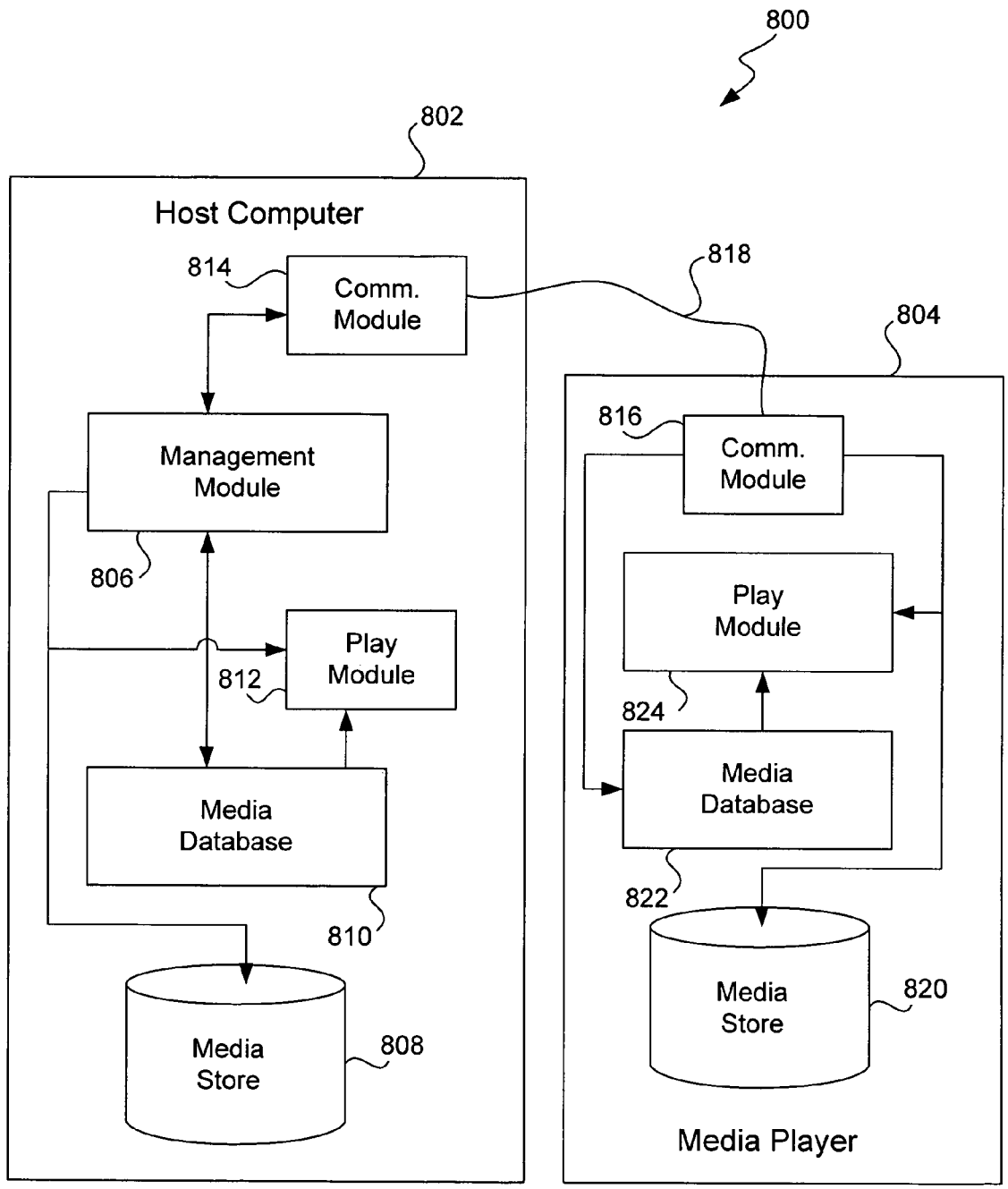
FIG. 8 is a block diagram of a media management system according to one embodiment of the invention.

FIG. 8 is a block diagram of a media management system 800 according to one embodiment of the invention. The media management system 800 includes a host computer 802 and a media player 804. The host computer 802 is typically a personal computer. The host computer, among other conventional components, includes a management module 806 which is a software module. The management module 806 provides for centralized management of media items (and/or playlists) not only on the host computer 802 but also on the media player 804. More particularly, the management module 806 manages those media items stored in a media store 808 associated with the host computer 802. The management module 806 also interacts with a media database 810 to store media information associated with the media items stored in the media store 808.

The media information pertains to characteristics or attributes of the media items. For example, in the case of audio or audiovisual media, the media information can include one or more of: title, album, track, artist, composer and genre. These types of media information are specific to particular media items. In addition, the media information can pertain to quality characteristics of the media items. Examples of quality characteristics of media items can include one or more of: bit rate, sample rate, equalization setting, volume adjustment, start/stop and total time.

Still further, the host computer 802 includes a play module 812. The play module 812 is a software module that can be utilized to play certain media items stored in the media store 808. The play module 812 can also display (on a display screen) or otherwise utilize media information from the media database 810. Typically, the media information of interest corresponds to the media items to be played by the play module 812.

The host computer 802 also includes a communication module 814 that couples to a corresponding communication module 816 within the media player 804. A connection or link 818 removeably couples the communication modules 814 and 816. In one embodiment, the connection or link 818 is a data bus, such as a FIREWIRE bus or a USB, which is well known in the art.

The media player 804 also includes a media store 820 that stores media items within the media player 804. The media items being stored to the media store 820 are typically received over the connection or link 818 from the host computer 802. More particularly, the management module 806 sends all or certain of those media items residing on the media store 808 over the connection or link 818 to the media store 820 within the media player 804. Additionally, the corresponding media information for the media items that is also delivered to the media player 804 from the host computer 802 can be stored in a media database 822. In this regard, certain media information from the media database 810 within the host computer 802 can be sent to the media database 822 within the media player 804 over the connection or link 818. Still further, playlists identifying certain of the media items can also be sent by the management module 806 over the connection or link 818 to the media store 820 or the media database 822 within the media player 804.

Furthermore, the media player 804 includes a play module 824 that couples to the media store 820 and the media database 822. The play module 824 is a software module that can be utilized to play certain media items stored in the media store 820. The play module 824 can also display (on a display screen) or otherwise utilize media information from the media database 822. Typically, the media information of interest corresponds to the media items to be played by the play module 824.

Hence, in one embodiment, the media player 804 has limited or no capability to manage media items on the media player 804. However, the management module 806 within the host computer 802 can indirectly manage the media items residing on the media player 804. For example, to "add" a media item to the media player 804, the management module 806 serves to identify the media item to be added to the media player 804 from the media store 808 and then causes the identified media item to be delivered to the media player 804. As another example, to "delete" a media item from the media player 804, the management module 806 serves to identify the media item to be deleted from the media store 808 and then causes the identified media item to be deleted from the media player 804. As still another example, if changes (i.e., alterations) to characteristics of a media item were made at the host computer 802 using the management module 806, then such characteristics can also be carried over to the corresponding media item on the media player 804. In one implementation, the additions, deletions and/or changes occur in a batch-like process during synchronization of the media items on the media player 804 with the media items on the host computer 802.

In another embodiment, the media player 804 has limited or no capability to manage playlists on the media player 804. However, the management module 806 within the host computer 802 through management of the playlists residing on the host computer can indirectly manage the playlists residing on the media player 804. In this regard, additions, deletions or changes to playlists can be performed on the host computer 802 and then by carried over to the media player 804 when delivered thereto.

As previously noted, synchronization is a form of media management. The ability to automatically initiate synchronization was also previously discussed. Still further, however, the synchronization between devices can be restricted so as to prevent automatic synchronization when the host computer and media player do not recognize one another.

Figure 9:
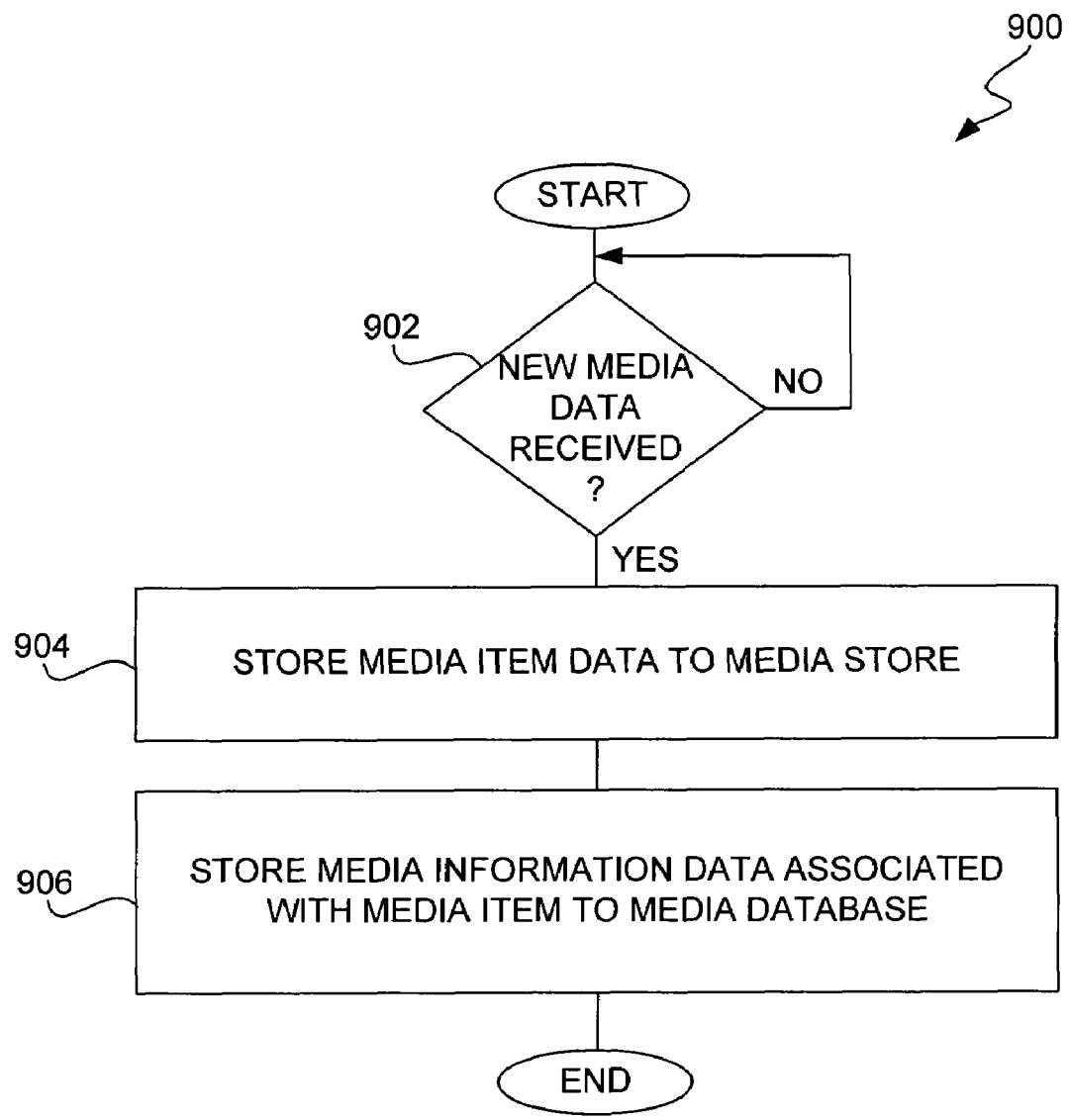
FIG. 9 is a flow diagram of media download processing according to one embodiment of the invention.

FIG. 9 is a flow diagram of media download processing 900 according to one embodiment of the invention. The media download processing 900 is, for example, processing performed by a media player. For example, the media player can be the media player 804 illustrated in FIG. 8, or some other media player.

The media download processing 900 begins with a decision 902 that determines whether new media data has been received. Here, the decision 902 determines whether new media data is being received from a host computer (personal computer). Typically, the new media data would be received at the media player when the host computer downloads media data from the host computer to the media player. When the decision 902 determines that new media data has not been received, then the media download processing 900 awaits such data.

Once the decision 902 determines that new media data has been received, the media data is stored to the media player. More specifically, the media data being received can include one or both of media item data and media information data. The media information data pertains to attributes or characteristics of the corresponding media items. The media information can vary with application. In one implementation, the media information includes at least descriptive attributes such as song title, album name and artist name. Further, the media information can include quality characteristics for the media items. Examples of such quality characteristics include bit rate, sample rate, equalization setting, volume adjustment, start/stop and total time.

In any case, the new media data is processed by the media download processing 900 as follows. The media item data is stored 904 to a media store associated with the media player. The media item data pertains to one or more media items. Further, the media information data associated with the one or more media items is stored 906 to a media database. The media database is also associated with the media player. Following the operation 906, the media download processing 900 is complete and ends.

Equalization settings pertain to amplitude settings for a plurality of different frequency bands, as is commonplace with an equalizer. These settings can be set by a user or can be set from selection of one of a plurality of predetermined equalization settings. These equalization settings, whether predetermined or customized, enable the adjustment of the dynamic range of the player device to match the style of music one is listening to. Further, the equalizer settings utilized on the host computer side can be linked to corresponding equalizer settings on the media player side. In one embodiment, each of the equalization settings that are stored within the media database can pertain to a single media item. As an example, when the media items are songs or audio files, the equalization settings can be provided for each song or audio file. More generally, there can be a one-to-one correspondence between quality characteristics (e.g., equalization settings) and media items such that, when played, each media item would be played in accordance with its own corresponding quality characteristics. Hence, the quality characteristics can be provided on a media item by media item basis.

As previously noted, one quality characteristic of the media information is equalization settings. In one embodiment, the host computer and/or the media player provide predetermined equalization settings that are identified by a descriptive name. Hence, a user can simply select one of the descriptive names to choose the associated equalizer settings. Table 1 below provides examples of various equalization settings that are predetermined and identified by descriptive names.

| EQUALIZER PRESETS |
| --- |
| ACOUSTIC |
| BASS BOOSTER |
| BASS REDUCER |
| CLASSICAL |
| DANCE |
| DEEP |
| ELECTRONIC |
| FLAT |
| HIP HOP |
| JAZZ |
| LATIN |
| LOUNGE |
| PIANO |
| POP |
| R&B |
| ROCK |
| SMALL SPEAKERS |
| SPOKEN WORD |
| TREBLE BOOSTER |
| TREBLE REDUCER |
| VOCAL BOOSTER |

Figure 10:
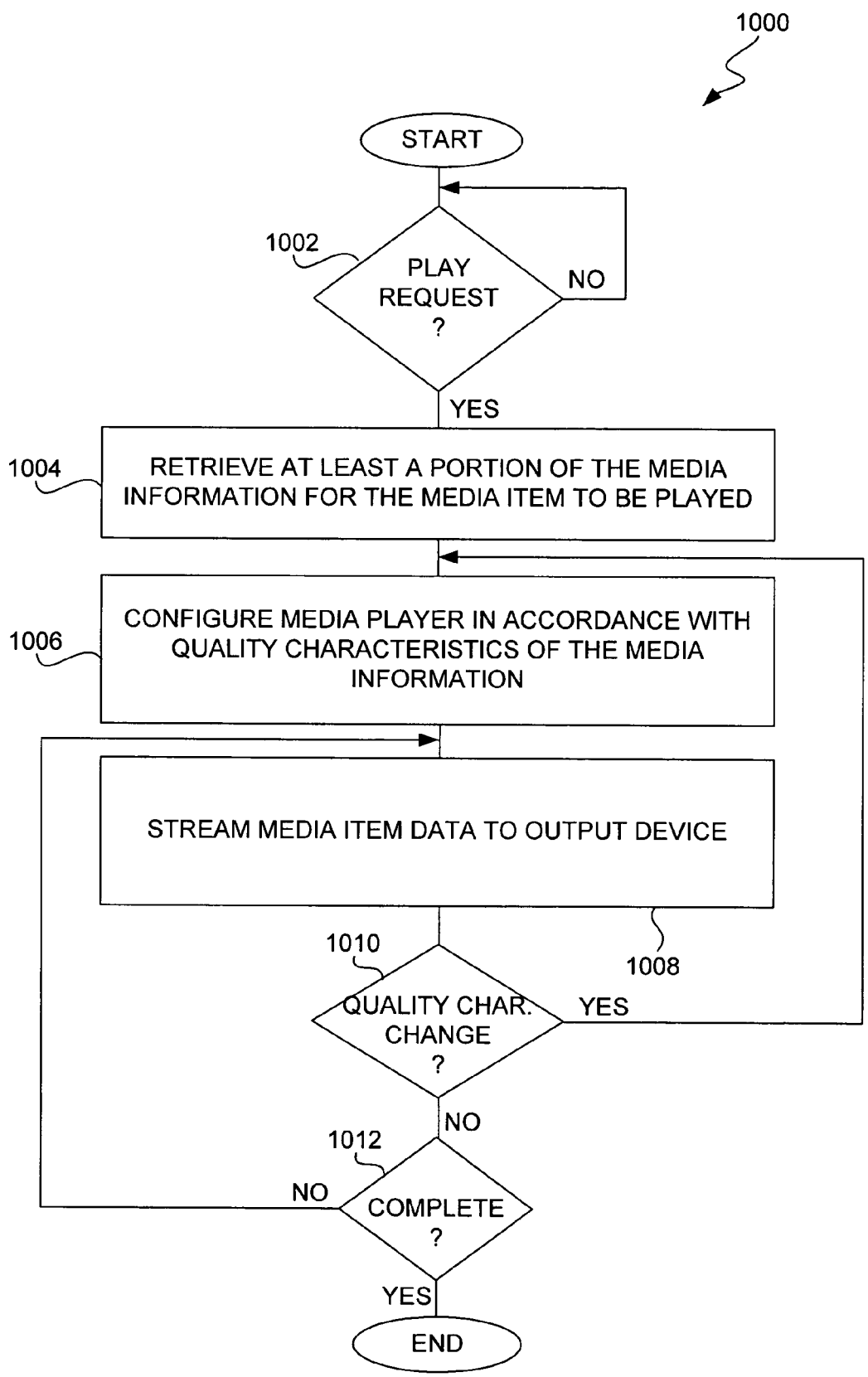
FIG. 10 is a flow diagram of media play processing according to one embodiment of the invention.

FIG. 10 is a flow diagram of media play processing 1000 according to one embodiment of the invention. The media play processing 1000 is, for example, performed by a media player, such as the media player 800 illustrated in FIG. 8, or some other media player.

The media play processing 1000 begins with a decision 1002 that determines whether a play request has been received. Here, a play request is typically initiated by a user of the media device. Hence, when the decision 1002 determines that a play request has not yet been received, the media play processing 1000 awaits such a request. When the decision 1002 determines that a play request has been received, the media play processing 1000 then retrieves 1004 at least a portion of the media information for the media item to be played. Here, the media information can vary as to its purposes and thus only a portion of the media information may be useful for playing the media item.

After the media information has been retrieved 1004, the media player is configured 1006 in accordance with one or more of the quality characteristics of the media information. Here, to the extent that the one or more quality characteristics of the media information can be used to configure the media player, the media player is so configured 1006. For example, in the case of equalization settings, the media player can be configured to operate its internal amplifier in accordance with the equalization settings provided by the quality characteristics associated with the media item to be played.

Subsequently, the media item data is streamed 1008 to an output device. For example, the streaming 1008 can cause the media item data to be retrieved from a local media store and directed to an output device (e.g., speaker and/or display screen) of the media player. The streaming 1008 of the media item data to the output device operates to produce a media output (audio and/or video) that results by playing the media item. Given that the media information is provided to the media player by the host computer, the media information set or configured for media items at the host computer is able to also be used in playing the media items on the media player.

Next, a decision 1010 determines whether a quality characteristic has changed. Typically, the decision 1010 can be activated when a user interacts with a Graphical User Interface (GUI) associated with the media player to manually change a quality characteristic for the media item being played. For example, a user could interact with a GUI for the media player to change the equalization settings. This could be on a per-media item or per-media player basis. Hence, when the decision 1010 determines that a quality characteristic has been changed, the media play processing 1000 can return to repeat the operation 1006 and subsequent operations. At this point, the media player can be reconfigured in accordance with the updated quality characteristics and then the media item can continue to thereafter be played in accordance with the updated quality characteristics. Such an implementation allows the user of the media player to manually alter the quality characteristics for the media player, overall or for a particular media item. However, it should be noted that the ability of the user to make manual changes to the quality characteristics can be restricted. For example, in one embodiment, quality characteristic settings provided by the host computer can override manual user settings.

On the other hand, when the decision 1010 determines that the quality characteristics have not changed, then a decision 1012 determines whether the media play processing 1000 is completed. When the decision 1012 determines that the media play processing 1000 has not completed, then the media play processing 1000 returns to repeat the operation 1008 and subsequent operations. Alternatively, when the decision 1012 determines that the media play processing 1000 has completed, then the media play processing 1000 is complete and ends.

Figure 11:
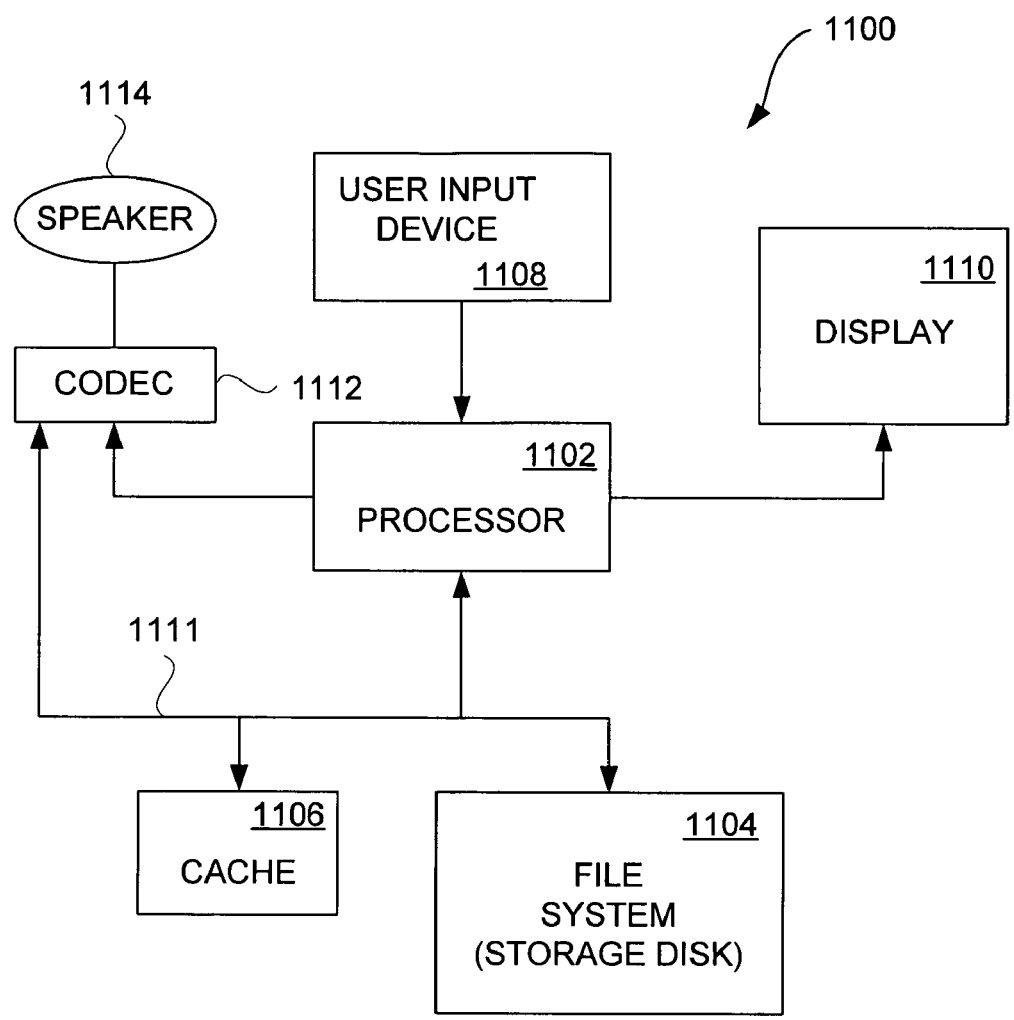
FIG. 11 is a block diagram of a media player according to one embodiment of the invention.

FIG. 11 is a block diagram of a media player 1100 according to one embodiment of the invention. The media player 1100 includes a processor 1102 that pertains to a microprocessor or controller for controlling the overall operation of the media player 1100. The media player 1100 stores media data pertaining to media items in a file system 1104 and a cache 1106. The file system 1104 is, typically, a storage disk or a plurality of disks. The file system 1104 typically provides high capacity storage capability for the media player 1100. However, since the access time to the file system 1104 is relatively slow, the media player 1100 can also include a cache 1106. The cache 1106 is, for example, Random-Access Memory (RAM) provided by semiconductor memory. The relative access time to the cache 1106 is substantially shorter than for the file system 1104. However, the cache 1106 does not have the large storage capacity of the file system 1104. Further, the file system 1104, when active, consumes more power than does the cache 1106. The power consumption is often a concern when the media player 1100 is a portable media player that is powered by a battery (not shown). The media player 1100 also includes a RAM 1120 and a Read-Only Memory (ROM) 1122. The ROM 1122 can store programs, utilities or processes to be executed in a non-volatile manner. The RAM 1120 provides volatile data storage, such as for the cache 1106.

The media player 1100 also includes a user input device 1108 that allows a user of the media player 1100 to interact with the media player 1100. For example, the user input device 1108 can take a variety of forms, such as a button, keypad, dial, etc. Still further, the media player 1100 includes a display 1110 (screen display) that can be controlled by the processor 1102 to display information to the user. A data bus 1111 can facilitate data transfer between at least the file system 1104, the cache 1106, the processor 1102, and the CODEC 1112.

In one embodiment, the media player 1100 serves to store a plurality of media items (e.g., songs) in the file system 1104. When a user desires to have the media player play a particular media item, a list of available media items is displayed on the display 1110. Then, using the user input device 1108, a user can select one of the available media items. The processor 1102, upon receiving a selection of a particular media item, supplies the media data (e.g., audio file) for the particular media item to a coder/decoder (CODEC) 1112. The CODEC 1112 then produces analog output signals for a speaker 1114. The speaker 1114 can be a speaker internal to the media player 1100 or external to the media player 1100. For example, headphones or earphones that connect to the media player 1100 would be considered an external speaker.

The media player 1100 also includes a bus interface 1116 that couples to a data link 1118. The data link 1118 allows the media player 1100 to couple to a host computer.

Although the media items of emphasis in several of the above embodiments were audio items (e.g., audio files or songs), the media items are not limited to audio items. For example, the media item can alternatively pertain to videos (e.g., movies) or images (e.g., photos).

The various aspects, embodiments, implementations or features of the invention can be used separately or in any combination.

The invention is preferably implemented by software, but can also be implemented in hardware or a combination of hardware and software. The invention can also be embodied as computer readable code on a computer readable medium. The computer readable medium is any data storage device that can store data which can thereafter be read by a computer system. Examples of the computer readable medium include read-only memory, random-access memory, CD-ROMs, DVDs, magnetic tape, optical data storage devices, and carrier waves. The computer readable medium can also be distributed over network-coupled computer systems so that the computer readable code is stored and executed in a distributed fashion.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method performed by a portable device capable of playing media items, the method comprising:

receiving a media item and n-band graphic equalizer setting values only associated with the received media item from a host device; and generating m filters to approximate the n-band graphic equalizer settings, where m is less than n, by:

identifying more than m filter patterns, in a composite frequency response shape representing the n-band graphic equalizer setting values, each filter pattern corresponding to a predetermined filter type from a set of filter types;

creating a plurality of identified filters by identifying a filter of the predetermined filter type for each of the more than m identified filter patterns;

determining parameters for each identified filter such that the plurality of identified filters approximates the composite frequency response shape representing the n-band graphic equalizer setting values;

assigning a weighting value to each of the plurality of filters, wherein each weighting value is assigned based upon how much of an impact the corresponding filter has on the composite frequency response shape; and limiting the number of the plurality of identified filters by selecting the m filters having the highest weighting values.

2. The method of claim 1, wherein the set of filter types comprises a low-shelf filter, a high-shelf filter, and a parametric filter.

3. The method of claim 2, wherein the creating comprises identifying at most one low-shelf filter pattern, at most one high-shelf filter pattern, and one or more parametric filter patterns in the composite frequency response shape representing the n-band graphic equalizer setting values.

4. The method of claim 1, further comprising playing the media item using the m identified filters.

5. The method of claim 1, further comprising determining that the n-band graphic equalizer setting values associated with the media item have changed.

6. The method of claim 5, further comprising receiving changed n-band graphic equalizer setting values to be associated with the media item from a user interface of a portable media device.

7. The method of claim 6, further comprising associating the changed n-band graphic equalizer setting values with the media item.

8. The method of claim 6, further comprising, in response to receiving the changed n-band graphic equalizer settings, generating a second set of m filters to approximate the changed n-band graphic equalizer settings.

9. The method of claim 8, wherein determining that the n-band graphic equalizer setting values associated with the media item have changed and generating the second set of m filters are performed during the playing of the media item.

10. The method as recited in claim 1, wherein the identified filters comprise second order recursive filters.

11. A portable media device comprising:
a communications module to receive a media item from a host computer having greater computational resources than the portable media device, and to further receive equalizer setting information from the host computer, the equalizer setting information being only associated with the received media item;
a data store for storing the received media item and the associated equalizer setting information received from the host computer; and
a processor operatively connected to the data store, wherein the processor operates to acquire equalizer setting values based on the equalizer setting information, to approximate the equalizer setting values with a reduced filter order approximation, and to present the media item in accordance with the reduced filter order approximation,
wherein the processor approximates the equalizer setting values with a reduced filter order approximation by:
identifying more than m filter patterns in a composite frequency response shape representing the equalizer setting values, each filter pattern corresponding to a predetermined filter type from a set of filter types;
creating a plurality of identified filters by identifying a filter of the predetermined filter type for each of the more than m identified filter patterns;
determining parameters for each identified filter such that the plurality of identified filters approximates the composite frequency response shape representing the equalizer setting values;
assigning a weighting value to each of the plurality of identified filters, wherein each weighting value is assigned based upon how much of an impact the corresponding filter has on the composite frequency response shape; and
limiting the number of the plurality of identified filters by selecting the m filters having the highest weighting values.

12. The portable media device of claim 11, further comprising a coder/decoder (CODEC) to receive the presentation of the media item in accordance with the reduced filter order approximation and to generate an analog output signal representing the media item in accordance with the reduced filter order approximation.

13. The portable media device of claim 12, further comprising a speaker coupled to the CODEC, wherein the speaker converts the analog output signal to sound, wherein the sound is substantially similar to sound produced when the media item is played on the host computer in accordance with the equalizer information associated with the media item.

14. The portable media device of claim 11, wherein the equalizer setting information associated with the media item received from the host computer is configured to be used by host computer to present the media item, the equalizer setting information being related to a graphic equalizer requiring greater computational resources than available from the processor of the portable media device for the purpose of implementing a graphic equalizer on the portable device.

15. A computer-readable medium having stored thereon data representing instructions that, when executed by the processor of a portable device capable of playing media items, cause the processor to perform operations comprising:
receiving a media item and n-band graphic equalizer setting values only associated with the received media item from a host device; and
generating m filters to approximate the n-band graphic equalizer settings, where m is less than n, by:
identifying more than m filter patterns, in a composite frequency response shape representing the n-band graphic equalizer setting values, each filter pattern corresponding to a predetermined filter type from a set of filter types;
creating a plurality of identified filters by identifying a filter of the predetermined filter type for each of the more than m identified filter patterns;
determining parameters for each identified filter such that the plurality of identified filters approximates the composite frequency response shape representing the n-band graphic equalizer setting values;
assigning a weighting value to each of the plurality of filters, wherein each weighting value is assigned based upon how much of an impact the corresponding filter has on the composite frequency response shape; and
limiting the number of the plurality of identified filters by selecting the m filters having the highest weighting values.

16. The computer-readable medium of claim 15, wherein the set of filter types comprises a low-shelf filter, a high-shelf filter, and a parametric filter.

17. The computer-readable medium of claim 16, wherein the processor creates the plurality of identified filter patterns in the composite frequency response shape representing the n-band graphic equalizer setting values by identifying at most one low-shelf filter pattern, at most one high-shelf filter pattern, and one or more parametric filter patterns in the composite frequency response shape representing the n-band graphic equalizer setting values.

18. The computer-readable medium of claim 15, further comprising playing the media item using the m filters.

19. The computer-readable medium of claim 18, wherein the instructions further cause the processor to determine that the n-band graphic equalizer setting values associated with the media item have changed and receiving changed n-band graphic equalizer setting values to be associated with the media item from a user interface of the portable media device from a user interface of the portable media device.

20. The computer-readable medium of claim 19, wherein the instructions further cause the processor to associate the changed n-band graphic equalizer setting values with the media item.

21. The computer-readable medium of claim 20, wherein the instructions further cause the processor to, in response to receiving the changed n-band graphic equalizer settings, generate a second set of m filters to approximate the changed n-band graphic equalizer settings.

22. The computer-readable medium of claim 21, wherein determining that the n-band graphic equalizer setting values associated with the media item have changed and generating the second set of m filters are performed during the playing of the media item.

23. The computer-readable medium as recited in claim 15, wherein the plurality of identified filters comprise second order recursive filters.

* * * * *

UNITED STATES PATENT AND TRADEMARK OFFICE
CERTIFICATE OF CORRECTION

| | | |
|---|---|---|
| PATENT NO. | : 7,711,129 B2 | Page 1 of 1 |
| APPLICATION NO. | : 10/799526 | |
| DATED | : May 4, 2010 | |
| INVENTOR(S) | : Aram Lindahl et al. | |

It is certified that error appears in the above-identified patent and that said Letters Patent is hereby corrected as shown below:

On Sheet 7 of 12, in Figure 6, line 1, delete "Apprximation" and insert -- Approximation --, therefor.

In column 6, line 53, after "cut" insert -- . --.

In column 12, line 44, delete "a" and insert -- an --, therefor.

In column 12, line 52, delete "sin h)" and insert -- sinh) --, therefor.

In column 13, line 51, delete "removeably" and insert -- removably --, therefor.

In column 20, line 67, in Claim 19, after "device" delete "from a user interface of the portable media device".

Signed and Sealed this
Fifteenth Day of November, 2011

David J. Kappos
*Director of the United States Patent and Trademark Office*